(12) United States Patent
Kim et al.

(10) Patent No.: US 7,978,559 B2
(45) Date of Patent: Jul. 12, 2011

(54) SEMICONDUCTOR MEMORY DEVICE AND METHOD OF OPERATING THE SAME

(75) Inventors: Kyung-Woo Kim, Seoul (KR); Jong-Sin Yun, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 71 days.

(21) Appl. No.: 12/533,862

(22) Filed: Jul. 31, 2009

(65) Prior Publication Data

US 2010/0061176 A1  Mar. 11, 2010

(30) Foreign Application Priority Data

Sep. 8, 2008 (KR) .................. 10-2008-0088478

(51) Int. Cl.
*G11C 5/14* (2006.01)
(52) U.S. Cl. .............. 365/226; 365/210.1; 365/154; 365/227; 365/189.09
(58) Field of Classification Search ........... 365/210.1, 365/154, 227, 189.09
See application file for complete search history.

(56) References Cited

U.S. PATENT DOCUMENTS

| | | | | |
|---|---|---|---|---|
| 6,141,258 A * | 10/2000 | Kawasumi | ............... | 365/189.05 |
| 6,535,421 B1 * | 3/2003 | Ozawa | ............... | 365/185.09 |
| 6,804,143 B1 | 10/2004 | Hobson | | |
| 7,292,485 B1 * | 11/2007 | Lu et al. | ............... | 365/189.09 |
| 7,324,368 B2 | 1/2008 | Wang et al. | | |
| 2004/0160805 A1 * | 8/2004 | Rinerson et al. | ............... | 365/158 |
| 2006/0044865 A1 * | 3/2006 | Hirabayashi | ............... | 365/154 |
| 2007/0263447 A1 * | 11/2007 | Koike et al. | ............... | 365/185.18 |
| 2007/0268738 A1 | 11/2007 | Heinrich-Barna et al. | | |

FOREIGN PATENT DOCUMENTS

| | | |
|---|---|---|
| JP | 2007-066493 | 3/2007 |
| JP | 2007-328900 | 12/2007 |
| JP | 2008-065968 | 3/2008 |

OTHER PUBLICATIONS

English Abstract for Publication No. 2007-066493.
English Abstract for Publication No. 2007-328900.
English Abstract for Publication No. 2008-065968.

* cited by examiner

*Primary Examiner* — Hoai V Ho
*Assistant Examiner* — Jay Radke
(74) *Attorney, Agent, or Firm* — F. Chau & Associates, LLC

(57) ABSTRACT

A semiconductor memory device includes a plurality of word lines, a plurality of pairs of bit lines and complementary bit lines that cross the word lines, and a plurality of memory cells, each memory cell being disposed at a region where a respective word line and a pair of a bit line and a complementary bit line cross each other. A voltage control unit includes a plurality of elements connected in series between a power voltage source and the memory cells and are switched on/off in response to a control signal that controls an operation of the plurality of memory cells. The voltage control unit controls the voltage of the power voltage source to a predetermined level, thereby obtaining a controlled voltage to be supplied to the memory cells.

12 Claims, 4 Drawing Sheets

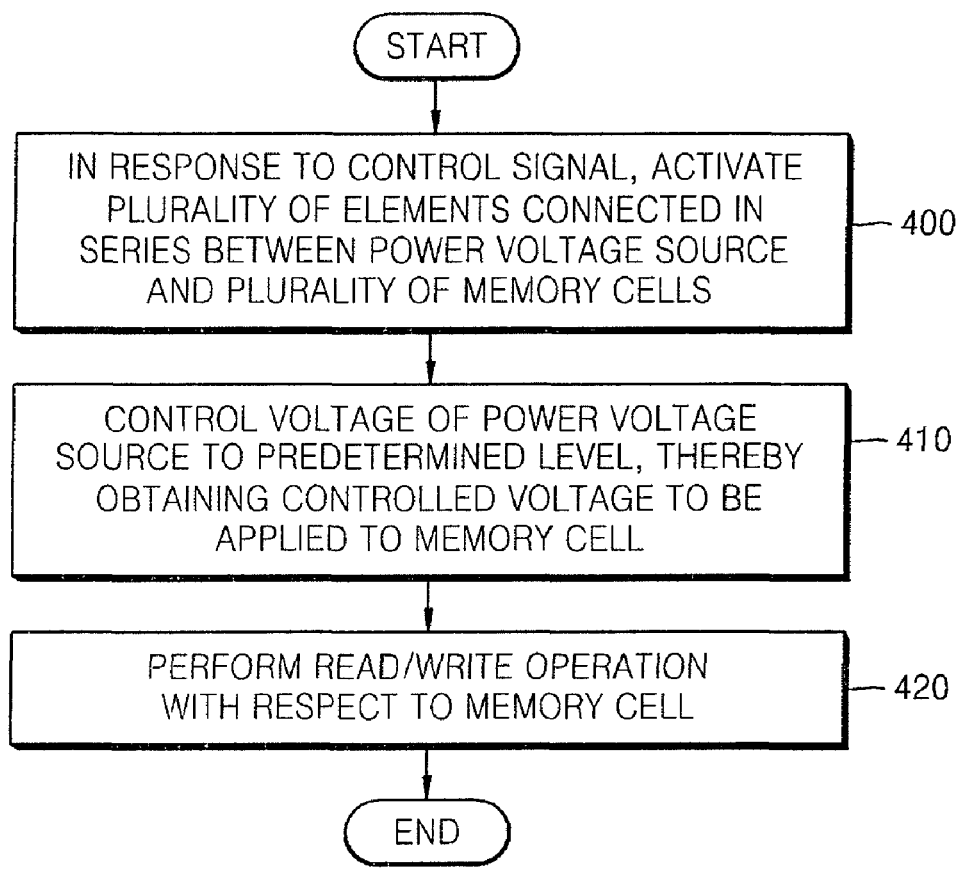

SEMICONDUCTOR MEMORY DEVICE AND METHOD OF OPERATING THE SAME

CROSS-REFERENCE TO RELATED APPLICATION

This application claims priority to and the benefit of Korean Patent Application No. 10-2008-0088478, filed on Sep. 8, 2008, in the Korean Intellectual Property Office, the entire content of which is incorporated by reference herein.

BACKGROUND

The present disclosure relates to memory devices, and, more particularly, to a semiconductor memory device that performs a stable write operation and a method of manufacturing the semiconductor memory device.

Semiconductor memory devices, which store data, are largely categorized into volatile memory devices and non-volatile memory devices. Volatile memory devices lose their stored data when their power supplies are removed, while non-volatile memory devices retain their stored data even when their power supplies are removed.

Examples of volatile memory devices include dynamic random access memory (DRAM) devices and static RAM (SRAM) devices. SRAM devices have lower power consumption and operate at a faster speed than DRAM devices, and thus SRAM devices are used as cache memory.

As SRAM memory cells become miniaturized, the size of the cells and the power voltages applied to the cells have decreased. As such, write assist elements that provide power voltages to the typical pair of cross-coupled inverters in the SRAM have become prevalent and the stable application of power voltage from the write assist elements during a write operation becomes needed.

SUMMARY

According to an exemplary embodiment of the present invention, a semiconductor memory device includes a plurality of word lines, a plurality of pairs of bit lines and complementary bit lines, and a plurality of memory cells, each memory cell being disposed at a region where a respective word line and a pair of a bit line and a complementary bit line cross each other. A voltage control unit includes a plurality of elements that are connected in series between a power voltage source and the memory cells and are switched on/off in response to a control signal that controls an operation of the memory cells. The voltage control unit controls the voltage of the power voltage source to supply a controlled voltage to the memory cells.

The elements may include a plurality of first switches that are activated when the control signal directs a write operation to one of the memory cells.

The first switches may include PMOS transistors that are turned on when the control signal directs the write operation to one of the memory cells.

When the control signal directs a write operation to one of the memory cells, the voltage control unit may apply a drain voltage of a selected PMOS transistor of the PMOS transistors connected in series to the memory cells.

When the control signal directs the write operation to one of the memory cells, the voltage control unit may apply a voltage obtained by subtracting a threshold voltage of at least one PMOS transistor connected between the power voltage source and the selected PMOS transistor from the voltage of the power voltage source to the memory cells.

Threshold voltages of the PMOS transistors may be different from each other or the same as each other.

The control signal may include a power gating control signal and a write enable signal.

The voltage control unit may further include a logic gate that performs a logic operation on the power gating control signal and the write enable signal and a plurality of second switches that are switched on/off in response to an output of the logic gate. The elements connected in series are switched on/off in response to an output of the corresponding second switches.

The logic gate may include a NAND gate that performs a NAND operation on the power gating control signal and the write enable signal.

Each of the second switches may include a PMOS transistor. The voltage of the power voltage source may be applied to the source of the PMOS transistor and the output of the logic gate may be applied to the gate of the PMOS transistor.

The memory cell may include a first inverter and a second inverter that are cross-coupled to each other and to which the controlled voltage is applied. A first access transistor is disposed between a first bit line of the pair and an output terminal of the first inverter and is turned on/off by a first word line of the plurality of word lines. A second access transistor is disposed between a first complementary bit line of the pair corresponding to the first bit line and an output terminal of the second inverter and is turned on/off by the first word line.

At least one dummy cell may be disposed between the voltage control unit and the memory cells.

In accordance with an exemplary embodiment of the present invention a method of operating a memory cell is provided. A plurality of transistor elements are connected in series between a power voltage source and the memory cell, the memory cell being coupled to a word line and a pair of a bit line and a complementary bit line. A write operation is performed to the memory cell. The transistor elements are activated in response to a control signal that controls the write operation of the memory cell. A portion of voltage from the power voltage source is applied to the memory cell as a controlled voltage.

The transistor elements may include PMOS transistors that are turned on when the control signal directs the write operation to the memory cell.

Applying to the memory cell a portion of voltage from the power voltage source may include subtracting threshold voltages of the PMOS transistors from the power voltage such that a voltage difference is provided to the memory cell as the controlled voltage.

The memory cell may be an SRAM memory cell and the controlled voltage is applied as a voltage source for a pair of cross-inverters of the SRAM memory cell.

In accordance with an exemplary embodiment of the present invention, an apparatus for controlling a voltage applied to a power line of cross-coupled inverters in an SRAM device during a write operation is provided. The apparatus includes a plurality of transistors coupled in series between a voltage source and the power line. The transistors are configured to turn on during the write operation such that a threshold voltage of one or more of the transistors is subtracted from a voltage of the voltage source and is applied to the power line.

BRIEF DESCRIPTION OF THE DRAWINGS

Exemplary embodiments of the present invention will be more clearly understood from the following detailed description taken in conjunction with the accompanying drawings in which:

FIG. 4 is a flowchart illustrating a method of operating a semiconductor memory device, according to an exemplary embodiment of the present invention.

DETAILED DESCRIPTION OF THE EXEMPLARY EMBODIMENTS

Figure 1:
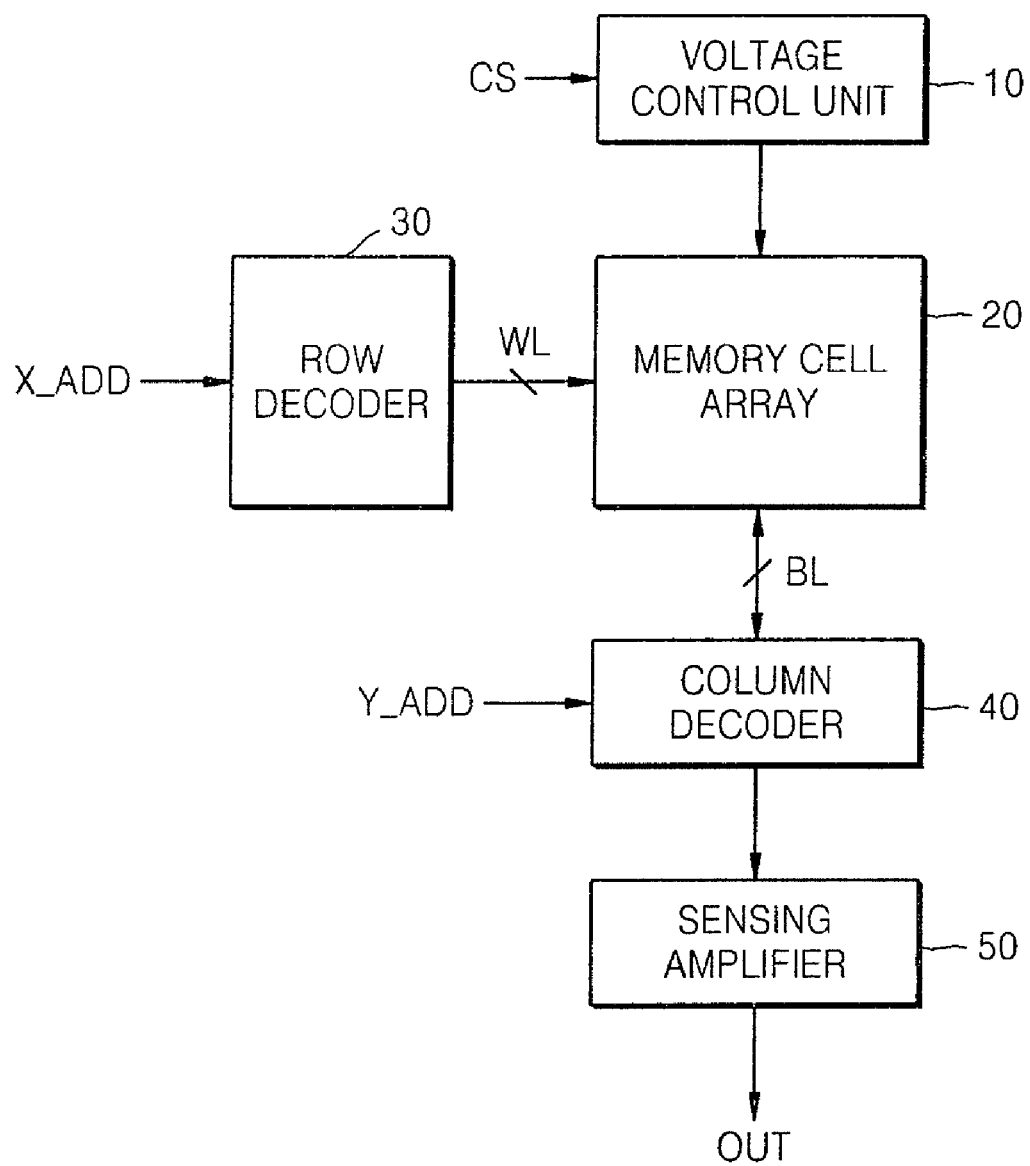
FIG. 1 is a block diagram of a semiconductor memory device according to an exemplary embodiment of the present invention.

Reference will now be made to the exemplary embodiments which are illustrated in the accompanying drawings. However, the exemplary embodiments are not limited to those embodiments described herein.

It will be understood that when an element, such as a component or region, is referred to as being "on," "connected to" or "coupled to" another element, it may be directly on, connected or coupled to the other element or intervening elements may be present. Like reference numerals refer to like elements throughout.

It will be understood that, although the terms first and second may be used herein to describe various elements, these elements should not be limited by these terms. These terms are only used to distinguish one element from another element. Thus, a first element discussed below could be termed a second element without departing from the teachings of the exemplary embodiments.

FIG. 1 is a block diagram of a semiconductor memory device according to an exemplary embodiment of the present invention. The semiconductor memory device includes a voltage control unit 10, a memory cell array 20, a row decoder 30, a column decoder 40, and a sensing amplifier 50.

The voltage control unit 10 controls a power voltage applied to the memory cell array 20. More particularly, the voltage control unit 10 controls the magnitude of the power voltage applied to the memory cell array 20 in response to a control signal CS that controls the operation of the memory cell array 20. The memory cell array 20 includes a plurality of memory cells disposed at regions where word lines WLs and bit lines BLs cross each other and at least one dummy cell.

The row decoder 30 decodes a row address X_ADD to activate a corresponding word line. The column decoder 40 decodes a column address Y_ADD to select a corresponding pair of bit lines. The sensing amplifier 50 amplifies the signals output from the column decoder 40 to generate an output signal.

Figure 2:
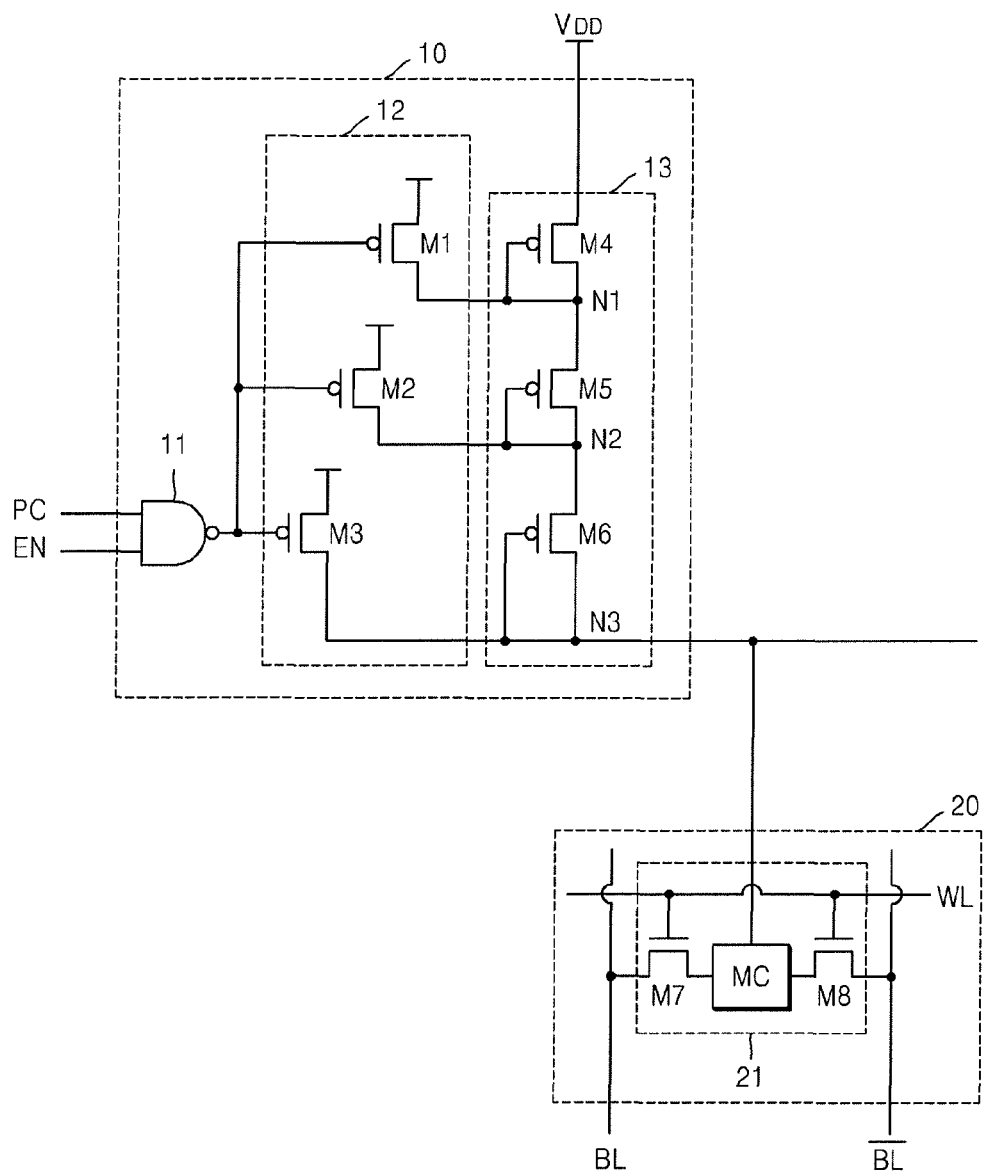
FIG. 2 is a circuit diagram of a voltage control unit and a memory cell array included in the semiconductor memory device of FIG. 1.
Figure 3:
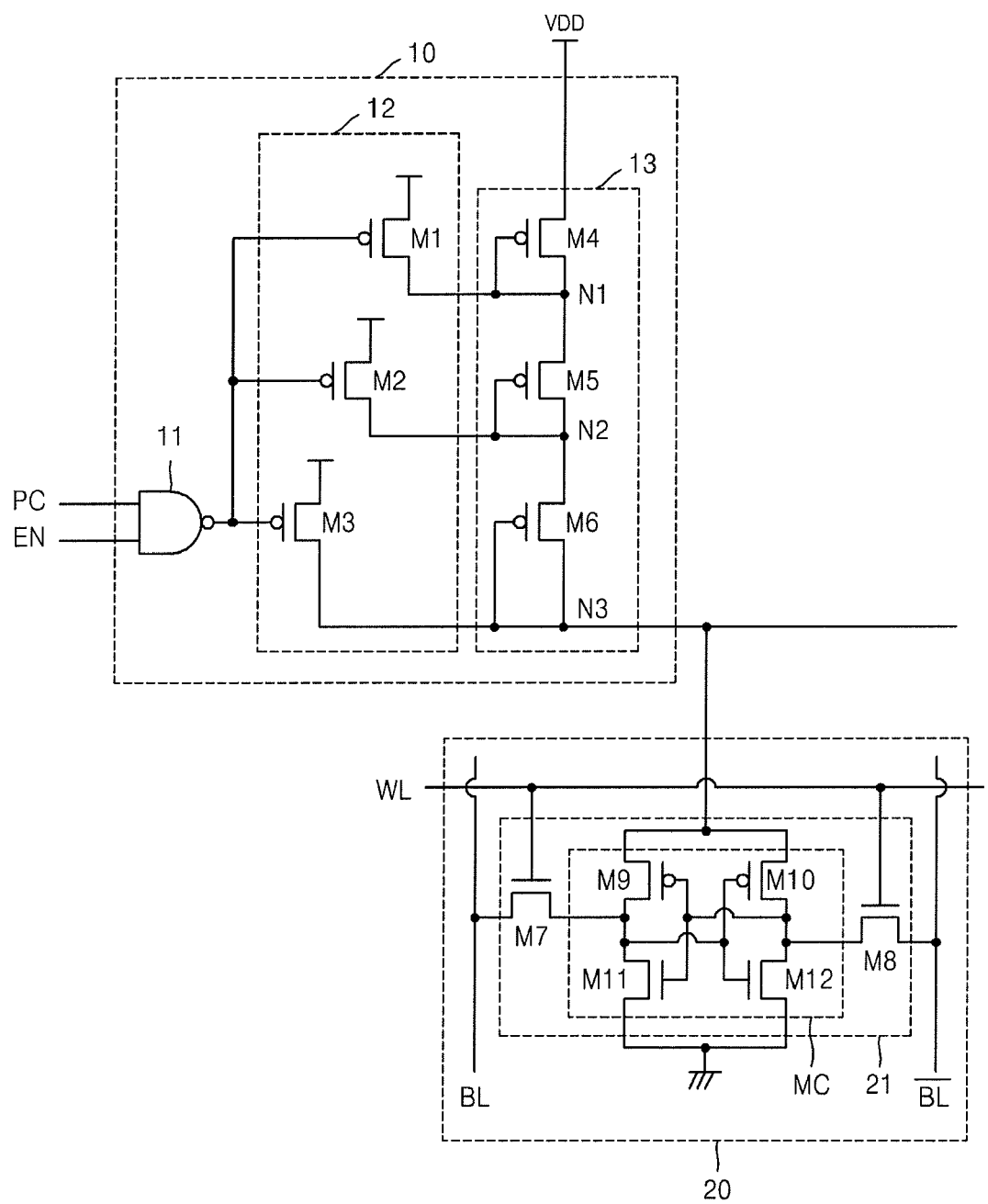
FIG. 3 is a more detailed circuit diagram of the voltage control unit and the memory cell array of FIG. 2.

FIG. 2 is a circuit diagram of the voltage control unit 10 and the memory cell array 20 included in the semiconductor memory device of FIG. 1. FIG. 3 is a more detailed circuit diagram of the voltage control unit 10 and the memory cell array 20 of FIG.

Referring to FIGS. 2 and 3, the voltage control unit 10 includes a logic gate 11, a switching circuit 12, and a write assist circuit 13. As noted above, as memory cells have become miniaturized, the size of memory cells and the power voltage applied to the memory cells have decreased. Accordingly, assisting elements that assist the operation of the memory cells have become prevalent. Thus, in an exemplary embodiment, the voltage control unit 10 includes a write assist circuit 13.

The memory cell array 20 includes a plurality of memory cells 21. However, only one memory cell 21 is illustrated in FIGS. 2 and 3 as a representative example. In an exemplary embodiment of the present invention, the memory cell 21 is an SRAM cell, but is not limited thereto.

The logic gate 11 performs a logic operation on a power gating control signal PC and a write enable signal EN. In an exemplary embodiment, the logic gate 11 is a NAND gate. The power gating control signal PC controls the on/off operation of the voltage control unit 10, and the write enable signal EN is activated when a write operation to the memory cell 21 is performed.

In an exemplary embodiment of the present invention, if the power gating control signal PC is logic "high" and the write enable signal EN is logic "high," the output of the logic gate 11 is logic "low", and a read operation from the memory cell 21 is performed. In addition, if the power gating control signal PC is logic "low" and the write enable signal EN is logic "low," the output of the logic gate 11 is logic "high," and a write operation to the memory cell 21 is performed. If other logic gates are used as the logic gate 11 instead of a NAND gate, the output of the logic gate 11 in response to the power gating control signal PC and the write enable signal EN may change.

The switching circuit 12 includes a plurality of switches that are switched on/off in response to an output of the logic gate 11. In an exemplary embodiment, the switching circuit 12 includes a first PMOS transistor M1, a second PMOS transistor M2 and a third PMOS transistor M3. The source of each of the first PMOS transistor M1, the second PMOS transistor M2 and the third PMOS transistor M3 is connected to a power voltage source and an output of the logic gate 11 is input to the gate of each of the first through third PMOS transistors M1, M2, M3. In this regard, the drain of each of the PMOS transistors M1, M2, M3 is connected to one of a plurality of elements included in the write assist circuit 13. Although only three PMOS transistors M1, M2, M3 are illustrated in FIGS. 2 and 3, the exemplary embodiment of the present invention is not limited thereto, and the switching circuit 12 may include any number of PMOS transistors.

When a read operation from the memory cell 21 is performed, that is, when the output of the logic gate 11 is logic "low," the first through third PMOS transistors M1, M2, M3 included in the switching circuit 12 are turned on. On the other hand, when a write operation to the memory cell 21 is performed, that is, when the output of the logic gate 11 is logic "high," the first through third PMOS transistors M1, M2, M3 included in the switching circuit 12 are turned off.

The write assist circuit 13 assists write operations to the memory cell 21. The write assist circuit 13 is not activated when a read operation from the memory cell 21 is performed, and is activated only when a write operation with respect to the memory cell 21 is performed. More particularly, the write assist circuit 13 includes a plurality of elements M4, M5, M6 connected in series between the power voltage source supplying the voltage VDD and the memory cell array 20. In an exemplary embodiment, the plurality of elements M4, M5, M6 are PMOS transistors (hereinafter, also referred to as "fourth through sixth PMOS transistors M4, M5, M6). Although only three PMOS transistors M4, M5, M6 are illustrated in FIGS. 2 and 3, the exemplary embodiment of the present invention is not limited thereto, and the write assist circuit 13 may include any number of PMOS transistors.

In an exemplary embodiment, threshold voltages of the fourth through sixth PMOS transistors M4, M5, M6 may be different from one another. Alternatively, in an exemplary embodiment, the threshold voltages of the fourth through sixth PMOS transistors M4, M5, M6 may be the same as one another. Alternatively, in an exemplary embodiment, the threshold voltages of two of the fourth through sixth PMOS transistors M4, M5, M6 are the same as each other, and the threshold voltage of the other one of the fourth through sixth PMOS transistors M4, M5, M6 may be different therefrom.

In particular, the source of the fourth PMOS transistor M4 is connected to the power voltage source supplying the voltage VDD and a drain voltage of the first PMOS transistor M1 of the switching circuit 12 is input to the gate of the fourth PMOS transistor M4. The source of the fifth PMOS transistor M5 is connected to the drain of the fourth PMOS transistor M4 and a drain voltage of the second PMOS transistor M2 of the switching circuit 12 is input to the gate of the fifth PMOS transistor M5. The source of the sixth PMOS transistor M6 is connected to the drain of the fifth PMOS transistor M5 and a drain voltage of the third PMOS transistor M3 of the switching circuit 12 is input to the gate of the sixth PMOS transistor M6.

Referring to FIGS. 2 and 3, the fourth PMOS transistor M4 and the fifth PMOS transistor M5 are connected to each other via a first node N1. The fifth PMOS transistor M5 and the sixth PMOS transistor M6 are connected to each other via a second node N2. The sixth PMOS transistor M6 and the memory cell 21 are connected to each other via a third node N3. However, while the memory cell 21 in FIG. 3 is shown directly connected to node N3 in the exemplary embodiment, the memory cell 21 may be connected to any one of the first through third nodes N1, N2, N3, according to the characteristics of the memory cell 21.

When a read operation from the memory cell 21 is performed, all of the first through third PMOS transistors M1, M2, M3 included in the switching circuit 12 are turned on. Thus, a drain voltage of each of the first through third PMOS transistors M1, M2, M3 is logic "high," and the fourth through sixth PMOS transistors M4, M5, M6 included in the write assist circuit 13 are turned off. On the other hand, when a write operation with respect to the memory cell 21 is performed, all of the first through third PMOS transistors M1, M2, M3 included in the switching circuit 12 are turned off, and the fourth through sixth PMOS transistors M4, M5, M6 included in the write assist circuit 13 are turned on.

When the fourth through sixth PMOS transistors M4, M5, M6 are turned on, a drain voltage of the fourth PMOS transistor M4, that is, a voltage of the first node N1, has a voltage (VDD−Vtp1) obtained by subtracting a threshold voltage Vtp1 of the fourth PMOS transistor M4 from the voltage VDD of the power supply source. In addition, a drain voltage of the fifth PMOS transistor M5, that is, a voltage of the second node N2, has a voltage (VDD−(Vtp1+Vtp2)) obtained by subtracting the sum of the threshold voltage Vtp1 of the fourth PMOS transistor M4 and a threshold voltage Vtp2 of the fifth PMOS transistor M5 from the voltage VDD of the power supply source. In addition, a drain voltage of the sixth PMOS transistor M6, that is, a voltage of the third node N3, has a voltage (VDD−(Vtp1+Vtp2+Vtp3)) obtained by subtracting the sum of the threshold voltage Vtp1 of the fourth PMOS transistor M4, the threshold voltage Vtp2 of the fifth PMOS transistor M5, and a threshold voltage Vtp3 of the sixth PMOS transistor M6 from the voltage VDD of the power supply source.

If the voltage VDD of the power supply source is 1 V, the threshold voltage Vtp1 of the fourth PMOS transistor M4 is 0.3 V, the threshold voltage Vtp2 of the fifth PMOS transistor M5 is 0.2 V, and the threshold voltage Vtp3 of the sixth PMOS transistor M6 is 0.1 V, the fourth through sixth PMOS transistors M4, M5, M6 are turned on when the write enable signal EN directs a write operation with respect to the memory cell 21. In this case, the drain voltage of the fourth PMOS transistor M4, that is, the voltage of the first node N1, is 0.7 V (1 V−0.3 V), the drain voltage of the fifth PMOS transistor M5, that is, the voltage of the second node N2, is 0.5 V (1 V−(0.3+0.2) V), and the drain voltage of the sixth PMOS transistor M6, that is, the voltage of the third node N3, is 0.4 V (1 V−(0.3+0.2+0.1) V). When the memory cell 21 is connected to the first node N1, 0.7 V is applied to the memory cell 21. In this regard, when a write operation with respect to the memory cell 21 is not properly performed, a further decrease in the voltage applied to the memory cell 21 would be needed. As such, the memory cell 21 would be connected to the second node N2, rather than node N1, such that 0.5 V can be applied to the memory cell 21. However, even in this case, when a write operation with respect to the memory cell 21 is not properly performed, the memory cell 21 can be connected to the third node N3, whereby 0.4 V can be applied to the memory cell 21. Those skilled in the art would appreciate that an appropriate manual connection or electronic switching between the memory cell 21 and the nodes N1, N2, N3 would allow the desired node and its respective voltage to be selected and applied to the memory cell 21.

As described above, the voltage control unit 10 includes the write assist circuit 13 including the fourth through sixth PMOS transistors M4, M5, M6 connected in series, and thus, when a write operation with respect to the memory cell 21 is performed, voltages different from each other can be selectively applied to the memory cell 21. Accordingly, when a write operation with respect to the memory cell 21 is performed, an optimum voltage can be applied to the memory cell 21 from the voltage control unit 10, and a write operation margin can be increased in the memory cell 21.

In general, a write operation to memory cells are performed by converting a logic "high" stored in the memory cells to logic "low." When the voltage applied to each of the memory cells is, as described above, decreased to levels different from each other according to the fourth through sixth PMOS transistors connected in series, the voltage may be applied to each of the memory cells according to the characteristics of the memory cells. Accordingly, a write operation to each of the memory cells may be performed even faster and more stably.

The memory cell 21 is connected to the voltage control unit 10 and one of the first, second and third nodes N1, N2, N3. More particularly, the memory cell 21 is disposed in a region where one word line WL of the plurality of word lines, and one bit line BL of the plurality of bit lines and the corresponding complementary bit line /BL cross each other. The memory cell 21 includes first and second access transistors M7, M8 that are respectively connected to the word line WL and the bit line BL and the word line WL and the complementary bit line /BL and a data storing region MC to which the voltage from the voltage control unit 10 is applied.

The first access transistor M7 is an NMOS transistor, wherein the gate of the NMOS transistor is connected to the word line WL and the drain thereof is connected to the bit line BL, and the second access transistor M8 is an NMOS transistor, wherein the gate of the NMOS transistor is connected to the word line WL and the source thereof is connected to the complementary bit line /BL.

Referring to FIG. 3, the data storing region MC includes a pair of inverters cross-coupled to each other. The data storing region MC includes a first inverter having a seventh PMOS transistor M9 and a first NMOS transistor M11 and a second inverter having an eighth PMOS transistor M11 and a second NMOS transistor M12. However, in an exemplary embodiment of the present invention, the data storing region MC may include resistors instead of the seventh and eighth PMOS transistors M9, M10.

In an exemplary embodiment of the present invention, the semiconductor memory device may further include at least one dummy cell (not shown) at node between the voltage control unit 10 and the memory cell 21. In this case, the dummy cell may have substantially the same structure as that of the memory cell. Thus, when a write operation to the memory cell is performed, a stable reduced voltage in the write assist circuit may be applied to the dummy cell allowing the write operation to be performed in the memory cell at an even faster speed given the current draw of dummy cell and the resultant voltage drop at node from the voltage at node.

FIG. 4 is a flowchart illustrating a method of operating a semiconductor memory device, according to an exemplary embodiment of the present invention. In step 400, in response to a control signal that controls the operation of a plurality of memory cells, a plurality of elements connected in series between a power voltage source and the plurality of memory cells are activated. The control signal includes a power gating control signal and a write enable signal. In addition, the elements include a plurality of switches which are activated when the control signal directs a write operation to one of the memory cells. In an exemplary embodiment, the elements are PMOS transistors.

In step 410, when the elements are activated, a voltage of the power voltage source is controlled to a predetermined level, thereby obtaining a controlled voltage which is applicable to the memory cells. In this case, a drain voltage of a selected PMOS transistor of the plurality of PMOS transistors is applied to the memory cells. In particular, a voltage obtained by subtracting a threshold voltage of at least one transistor connected between the power voltage source and the selected PMOS transistor from the voltage of the power voltage source is applied to the memory cells.

In step 420, upon receiving the controlled voltage, a read operation or write operation is performed from/to the memory cells in response to a voltage of the word lines and bit lines.

While the present invention has been described with regard to exemplary embodiments of SRAM devices, exemplary embodiments of the present invention may also include a method and apparatus for applying compute readable codes onto various other compute readable recording medium. The compute readable recording medium is any data storage device that can store data which can be thereafter read by a computer system. Examples of the computer readable recording medium include read-only memory (ROM), random-access memory (RAM), CD-ROMs, magnetic tapes, floppy disks and optical data storage devices. The computer readable code can also be distributed over network coupled computer systems so that the computer readable code can be stored and executed in a distributed fashion. Here, a program stored in a recording medium is expressed in a series of instructions used directly or indirectly within a device with a data processing capability, such as, computers. Thus, a term "computer" involves all devices with data processing capability in which a particular function is performed according to a program using a memory, input/output devices, and arithmetic logic.

Although exemplary embodiments of the present invention have been described, those skilled in the art will readily appreciate that many modifications are possible to the exemplary embodiments. Accordingly, all such modifications are intended to be included within the scope of the following claims.

What is claimed is:

1. A semiconductor memory device comprising:
   a plurality of word lines;
   a plurality of pairs of bit lines and complementary bit lines;
   a plurality of memory cells, each memory cell being disposed at a region where a respective word line and a pair of a bit line and a complementary bit line cross each other; and
   a voltage control unit comprising a plurality of elements that are connected in series between a power voltage source and the memory cells and are switched on/off in response to a control signal that controls an operation of the memory cells,
   wherein the voltage control unit controls the voltage of the power voltage source to supply a controlled voltage to the memory cells,
   wherein the control signal comprises a power gating control signal and a write enable signal,
   wherein the voltage control unit further comprises:
      a logic gate that performs a logic operation on the power gating control signal and the write enable signal; and
      a plurality of second switches that are switched on/off in response to an output of the logic gate, and
      wherein the elements connected in series are each switched on/off in response to an output of a respective one of the plurality of second switches.

2. The semiconductor memory device of claim 1, wherein the elements comprise a plurality of first switches that are activated when the control signal directs a write operation to one of the memory cells.

3. The semiconductor memory device of claim 2, wherein the first switches comprise PMOS transistors that are turned on when the control signal directs the write operation to one of the memory cells.

4. The semiconductor memory device of claim 3, wherein, when the control signal directs a write operation to one of the memory cells, the voltage control unit applies a drain voltage of a selected PMOS transistor of the PMOS transistors connected in series to the memory cells.

5. The semiconductor memory device of claim 4, wherein, when the control signal directs the write operation to one of the memory cells, the voltage control unit applies a voltage obtained by subtracting a threshold voltage of at least one PMOS transistor connected between the power voltage source and the selected PMOS transistor from the voltage of the power voltage source to the memory cells.

6. The semiconductor memory device of claim 3, wherein threshold voltages of the PMOS transistors are different from each other.

7. The semiconductor memory device of claim 3, wherein threshold voltages of the PMOS transistors are the same as each other.

8. The semiconductor memory device of claim 1, wherein the logic gate is a NAND gate that performs a NAND operation on the power gating control signal and the write enable signal.

9. The semiconductor memory device of claim 1,
   wherein each of the second switches comprises a PMOS transistor, and
   wherein the voltage of the power voltage source is applied to the source of the PMOS transistor and the output of the logic gate is applied to the gate of the PMOS transistor.

10. The semiconductor memory device of claim 1, wherein a memory cell comprises:
   a first inverter and a second inverter that are cross-coupled to each other and to which the controlled voltage is applied;

a first access transistor that is disposed between a first bit line of the pair and an output terminal of the first inverter and is turned on/off by a first word line of the plurality of word lines; and a second access transistor that is disposed between a first complementary bit line of the pair corresponding to the first bit line and an output terminal of the second inverter and is turned on/off by the first word line.

11. The semiconductor memory device of claim 10, further comprising at least one dummy cell disposed between the voltage control unit and the memory cells.

12. An apparatus for controlling a voltage applied to a power line of cross-coupled inverters in an SRAM device during a write operation, the apparatus comprising:

a plurality of transistors coupled in series between a voltage source and the power line, the transistors being configured to turn on during the write operation such that a threshold voltage of one or more of the transistors is subtracted from a voltage of the voltage source and is applied to the power line;

a logic gate that performs a logic operation on a power gating control signal and a write enable signal;

a plurality of switches that are switched on/off in response to an output of the logic gate; and, wherein the plurality of transistors coupled in series are each switched on/off in response to an output of a respective one of the plurality of switches.

* * * * *